United States Patent [19]

Allen, Jr. et al.

[11] 3,865,623

[45] Feb. 11, 1975

[54] FULLY ADDITIVE PROCESS FOR MANUFACTURING PRINTED CIRCUIT BOARDS

[75] Inventors: Herbert J. Allen, Jr., Buffalo; Ronald Earl Todd, Fair Grove, both of Mo.; Jerry Wayne Wegman, Sr., Tampa, Fla.

[73] Assignee: Litton Systems Inc., Springfield, Mo. ; by said Allen and Todd

[22] Filed: Feb. 2, 1973

[21] Appl. No.: 328,913

[52] U.S. Cl. .......................... 117/212, 117/130 E

[51] Int. Cl. ............ B44d 1/18, H05k , B32b 15/00

[58] Field of Search ...................... 117/212, 130 E

[56] References Cited

UNITED STATES PATENTS

| | | | |
|---|---|---|---|
| 3,146,125 | 8/1964 | Schneble, Jr. | 117/212 |
| 3,573,973 | 3/1971 | Drotar et al. | 117/212 |
| 3,600,330 | 8/1971 | Schneble, Jr. | 117/212 |

*Primary Examiner*—John D. Welsh
*Attorney, Agent, or Firm*—Ronald M. Goldman; Alan C. Rose; Thomas A. Turner, Jr.

[57] ABSTRACT

Commencing with a commercially available electrically insulative laminate, such as paper-epoxy or glass-epoxy material, a predesigned pattern of holes is formed between the front and back sides of a circuit board in any conventional manner. The laminate is then immersed in an organic solvent to render the finish on the "buttercoat" receptive to the subsequent acid etch, and then is water rinsed. This is followed by immersion in an acid solution, such as chromic acid, to chemically abraid the laminate surface. Next the laminate is rinsed in water and thereupon immersed in a caustic solution to neutralize any traces of acid remaining from the preceding step. The laminate is then rinsed in another acid solution, such as hydrochloric acid. Thereafter the laminate is immersed in a catalyst, such as a tin-palladium solution, which conditions the surfaces of the laminate for electroless copper plating and that step is followed by a water rinse. Next the laminate is immersed in an accelerator which activates the catalyst, such as by freeing the metal palladium ions on the laminate which subsequently accelerates future plating. And this is followed by a water rinse. At this time the laminate is dried. Thereafter a layer of electrically nonconductive thermosetting material is applied onto each side of the laminate in the negative facsimile of the conductor pattern desired to form a permanent selectively applied conformal coating. The laminate is placed in an air circulating oven for approximately 30 minutes at 250°F. to heat set or cure the conformal coating. Thereafter the board is immersed in an electroless copper plating solution for a period of time sufficient to plate copper to the desired thickness on the surfaces and to plate the surfaces of the holes to form through-hole connections between the laminate surfaces.

2 Claims, 1 Drawing Figure

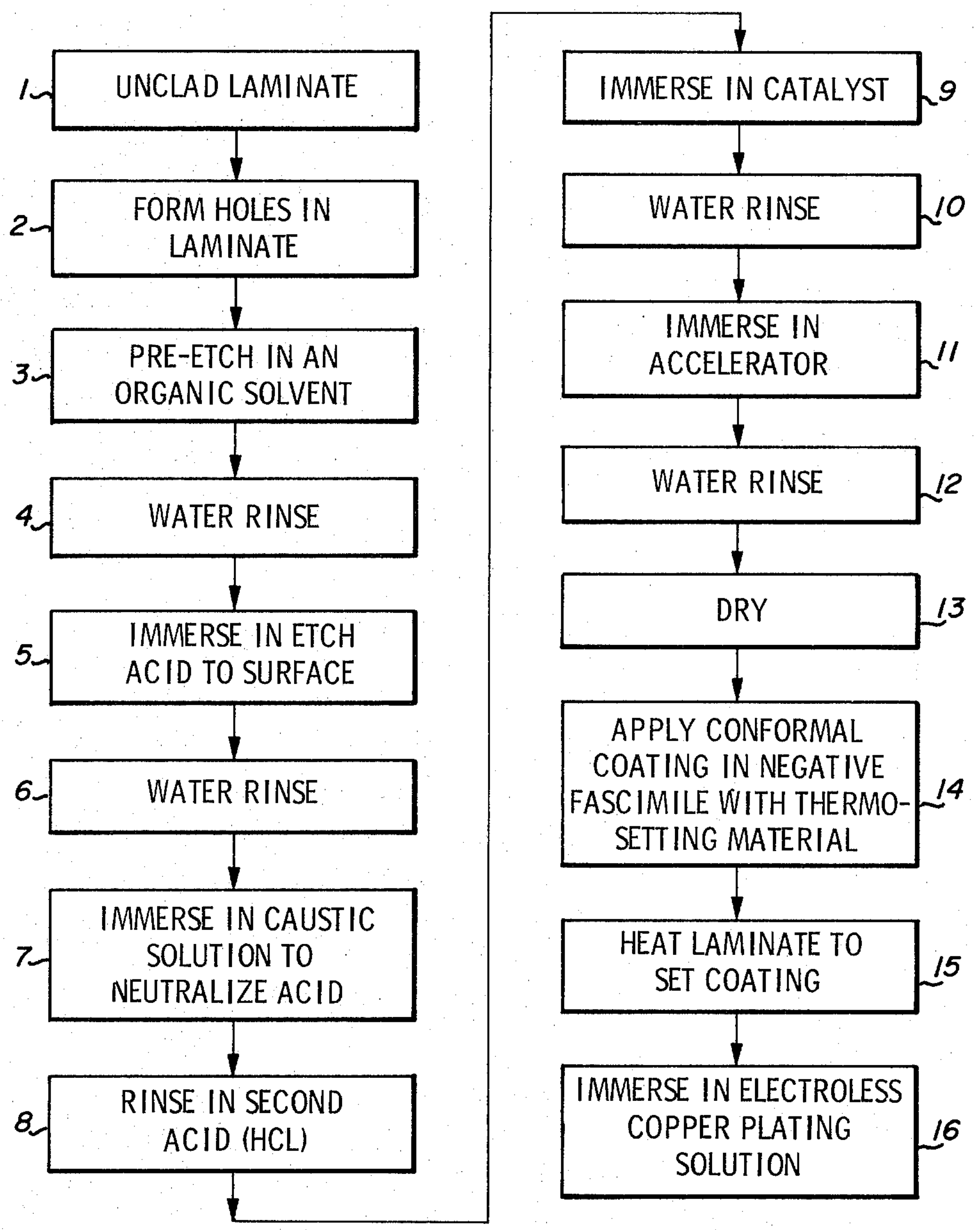
UNCLAD LAMINATE
1
FORM HOLES IN LAMINATE
2
PRE-ETCH IN AN ORGANIC SOLVENT
3
WATER RINSE
4
IMMERSE IN ETCH ACID TO SURFACE
5
WATER RINSE
6
IMMERSE IN CAUSTIC SOLUTION TO NEUTRALIZE ACID
7
RINSE IN SECOND ACID (HCL)
8
IMMERSE IN CATALYST
9
WATER RINSE
10
IMMERSE IN ACCELERATOR
11
WATER RINSE
12
DRY
13
APPLY CONFORMAL COATING IN NEGATIVE FASCIMILE WITH THERMO-SETTING MATERIAL
14
HEAT LAMINATE TO SET COATING
15
IMMERSE IN ELECTROLESS COPPER PLATING SOLUTION
16

FULLY ADDITIVE PROCESS FOR MANUFACTURING PRINTED CIRCUIT BOARDS

FIELD OF THE INVENTION

This invention relates to a fully additive process for manufacturing printed circuit boards and, more particularly, to a fully additive process for producing a printed circuit board having the desired conductor configuration on top and bottom surfaces and through-hole connections from conventional untreated laminate material without the necessity for any etching or stripping steps.

BACKGROUND OF THE INVENTION

The printed circuit board as is well known denotes a construction of electrical circuit wiring in which the wiring is formed with electrically conductive material rigidly attached to and supported on a flat insulating base material or board, much as ink appears as printed on paper. Typically a large number of conductors are so formed, which appear as patterns, on both the top and bottom surfaces of the flat base and some of these circuits on opposite surfaces are interconnected, typically, by means of through-hole connections, holes having conductor plated surfaces which extend between top surface conductors and bottom surface conductors on the base. Modern base materials employed for this purpose are laminates of glass-epoxy and paper-epoxy composites.

Presently available commerical processes for manufacturing printed circuit boards involve the removal of material, previously applied to the board, in one or more steps. The removal of material, such as by etching, is considered a "subtractive" step, and the step of adding material onto the board, such as by plating, is considered an "additive" step. It has long been desired to have available a process for manufacturing printed circuit boards that is fully additive: that is, during the manufacturing processes no material that has been provided or applied to the laminate in an earlier step of the process needs to be removed in a subsequent step of the process; and which uses conventional laminate materials. A process which does not require removal of material is effectively less expensive than one which does. Specifically "subtractive" steps are time consuming, they require a supply of extra chemical solutions, and they necessitate reclamation of metals to avoid waste, particularly where metal etches are employed. One current development for an additive process appears in U.S. Pat. No. 3,600,330, issued Aug. 17, 1971. While additive in nature, the disclosed process requires a specially treated laminate material, not the conventional epoxy paper or glass epoxy materials commercially available, in which a special ink coating has particles which are made conductive by subsequent treatment. Another example of additive circuitry appears in U.S. Pat. No. 3,573,973, issued Apr. 6, 1971, which starts with a special type of laminate material, polyimid or polyamid, to manufacture a tape or electrical conductor very rapidly. As is apparent, the economy of any additive process is offset if special laminates or nonconventional laminates must be used. To use other than conventional laminates requires an entire industry of suppliers to change their equipment, their processes, and go through the learning process of producing reliable laminates. And that would be reflected in a very high cost which, it is thought, renders such an additive process uncompetitive in price with circuit boards produced by conventional subtractive processes.

OBJECTS OF THE INVENTION

Accordingly, it is an object of the invention to provide a novel fully additive process for manufacturing printed circuit boards.

It is a further object of the invention to manufacture a printed circuit board from conventional laminate without the necessity for etching or other subtractive steps.

It is a still further object of the invention to provide a fully additive printed circuit board manufacturing process which provides good adhesion of conductor material to the insulative laminate, is easily controlled, contains through-hole connections, without the necessity for etching or other subtractive steps.

BRIEF SUMMARY OF THE INVENTION

A process for manufacturing printed circuit boards from conventional laminate materials without the necessity of any etching or stripping processes is disclosed. Commencing with a commercially available laminate, such as paper-epoxy or glass-epoxy material, a predesigned pattern of holes is formed between the front and back sides of the boards in any conventional manner. The laminate is then immersed in an organic solvent to render the finish on the buttercoat receptive to the acid and then is water rinsed. This if followed by immersion in an acid solution, such as chromic acid to chemically abraid the laminate surface. Next the laminate is rinsed in water and thereupon immersed in a caustic solution to neutralize any traces of acid remaining from the preceding step. The laminate is then rinsed in another acid solution, such as hydrochloric acid. Thereafter the laminate is immersed in a catalyst, such as a tin palladium solution, which conditions the surfaces of the laminate for electroless copper plating and that step is followed by a water rinse. Next the laminate is immersed in an accelerator which activates the catalyst, such as by freeing the metal palladium ions on the laminate which subsequently accelerates future plating. This is followed by a water rinse. At this time the laminate is dried, or allowed to dry. Thereafter a layer of thermosetting material is applied onto each side of the laminate in the negative facsimile of the conductor pattern desired to form a permanent selectively applied conformal coating. The laminate is placed in an air circulating oven for approximately 30 minutes at 250° F. to heat set the conformal coating. Thereafter the board is immersed in an electroless copper plating solution for a period of time sufficient to plate copper to the desired thickness on the surfaces and to plate the surfaces of the holes to form through-hole connections between the laminate surfaces.

The FIGURE of the drawing shows a flow diagram of the process of the invention.

DETAILED DESCRIPTION OF INVENTION

As illustrated in 1 of the FIGURE, an unclad laminate material is obtained. These laminates are commercially available and are of known structure and composition, including paper-phenolic, paper-epoxy, or epoxy-glass laminates. These are all electrically nonconductive or insulative materials presently in use in the printed circuit industry. For present purposes the circuit board material may be referred to as a laminate, as an insulating substrate, or as a board or base, interchangeably. As obtained the laminates have smooth, almost polished surfaces and a coating referred to as a buttercoat; the resin that covers the glass or paper on the surface of the laminate. In the next step, as at 2, the passages or holes are formed through the laminate in a predesigned pattern to provide various passages between the top and bottom sides of the circuit board which hereinafter become through-hole connections. Inasmuch as the conductor arrangement to be placed on the top and bottom laminate surfaces is known, the locations at which through-hole connections between circuit board conductors on opposite surfaces of the laminate is also fixed. The holes are made by any conventional technique, such as by drilling with programmed drilling equipment as is common in the industry. The laminate is then immersed in an organic solvent bath as at 3. Organic solvents used for this purpose are known, including di-methyl formamide. Other examples of such solvents are presented in U.S. Pat. No. 3,142,581 and U.S. Pat. No. 3,445,350. Suitably the di-methyl formamide is mixed with water in the ratio of 10 percent water to 90 percent di-methyl formamide by volume, the amount of water not being critical and serving to reduce the solvent activity, and with the solution at room temperature the average immersion time for the laminate is about 5 minutes. The board is immersed in this solvent for between approximately 3 to 10 minutes at 80° F. An epoxy-glass laminate material is immersed preferably for approximately 3 minutes while a paper-epoxy laminate is immersed preferably for approximately 5 minutes. Other solvents or surface conditioners, as variously termed, suitable for this purpose can be used, such as MacDermid Company's "Metex" 9091. The organic solvent attacks and softens the buttercoat on the laminate to improve the condition of the surface of the laminate in preparation for receiving and making more effective succeeding acid etch bath. This step is known and is referred to sometimes as a "pre-etch". The laminate is then removed from the solvent bath and rinsed in water as illustrated in 4 of the FIGURE. Thereafter, the laminate is immersed in an acid bath 5, suitably chromic acid in a concentration of 3.3 to 3.8 pounds acid per gallon, specific gravity 1.3 to 1.4, for approximately 5 minutes at a bath temperature of 150° F. The acid chemically roughens, etches, or abraids, as variously termed, the surfaces of the laminate, making the surface microporous. This porosity in turn allows the subsequent copper plating to rigidly attach to the board and provide a good bond therebetween as hereafter becomes more apparent. The laminate is then rinsed in water as at 6 to render the surface free from as much as possible of the acid and residues from the laminate. Thereupon as at 7 the laminate is immersed in a caustic or or base solution, such as a solution of sodium hydroxide, pH factor 12.3, at a bath temperature of 125° F. for a period of approximately 3 minutes. The sodium hydroxide bath neutralizes any traces of the chromic acid remaining on the laminate from preceding steps. In step 8 the laminate is rinsed in another acid bath, suitably hydrochloric acid, 20 percent by volume at a bath temperature of ambient, for approximately 30 seconds to 1 minute. This acid bath protects the catalyst from "dragin" which in turn causes the normality of the catalyst to remain at the desired level. The laminate as at 9 is placed in a catalyst bath, suitably any known tin-palladium solution, for approximately 2 minutes at a bath temperature of ambient. The 9F catalyst manufactured by the Shipley Company diluted with 9 parts hydrochloric acid (HCl) for each part of 9F, and comprising colloidal palladium having a protective stannic acid colloidal, is suitable for this purpose as well as any tin-palladium solution described in U.S. Pat. No. 3,011,920. As is known the catalyst is a colloidal solution which deposits small amounts of precious metal on the laminate. The catalyst metal is dissimilar to the metal to be plated, hence inherent electrical currents due to the dissimilar metals between the catalyst and the plating solution permits electroless plating as hereinafter becomes apparent. The catalyst prepares both the top and bottom laminate surfaces as well as the wall surfaces of the through-holes. The laminate is then given a water rinse in step 10 for some minutes and is thereupon immersed in an accelerator solution as at 11. The "accelerator" frees the metal palladium ions which subsequently allows them to attract the copper metal, consequently electroless copper plating is accelerated. Accelerator 19 sold by the Shipley Company is suitable. This comprises a solution which is acidic in nature which frees the palladium metal ions on the laminate from the catalyst. The laminate is then rinsed in water as at 12 and dried as at step 13. Drying is accomplished by allowing the laminate to stand until all of the moisture evaporates from the surfaces of laminate by placing the laminate in an air circulating oven.

After the laminate is dried, a selectively applied conformal coating is deposited upon the top and bottom surfaces of the substrate, as illustrated in 14, in the negative facsimile of the desired conductor configuration. This conformal coating material employed is pinhole-free, insoluble in water, electrically nonconducting, permanently adherent to the laminate, and most importantly, is capable of withstanding immersion in an electroless copper plating solution over extended periods of hours without degredation, decomposition, or detachment. A material found desirable for this purpose is an alkyd base resin, a synthetic ester resin, such as "184-12D" manufactured by the Wornow Company. This material is insoluble in the electroless copper plating solution, is electrically nonconductive, and is thermosetting. A stencil or stencils having the negative image of the ultimate conductor configuration is applied to the board surface and a squeegee dipped in the liquid resin is run over the stencil to apply the material to the laminate. After the thermosetting resin coating is deposited the laminate is placed in an air circulating oven as at 15 having temperatures of about 250° F. for approximately 30 minutes. The resin is thus cured or set and provides a firmly adherent coating which leaves exposed only those portions of the laminate on which copper is to be placed. Finally as in 16 the laminate is placed in a bath of electroless copper plating material which is maintained at a temperature of 110°–120° F. for a period of approximately 5 hours. A typical electroless plating solution consists of the Shipley Company's process "328 Coppermix" or "CP70 Coppermix", a proprietary electroless plating solution containing cupric ions, formaldehyde as a reducing agent for the cupric ions, a complexing agent for the cupric ions and a stabilizer. During the plating process the copper is built up on the laminate in those plates left exposed by the conformal coating. In addition the walls or passages of the holes which interconnect the top and bottom surfaces of the laminate are also plated to form a through-hole connection and plate portions of the conductors formed on the top of the board in electrical common with other portions of the conductive pattern being built up on the underside of the board. The copper conductors are built up in thickness to approximately 0.001 inches. Inasmuch as the conformal coating material is applied and comprises a thickness of 0.0009 inches the conformal coating is somewhat flush with the conductive pattern to provide a somewhat smooth finish on the surfaces of the board. Thereafter the laminate may be washed in water and dried as desired and the conformal coating remains in place.

Inasmuch as the conformal coating material is electrically nonconductive it does not affect the proper function of the board or interfere with the conductive pattern deposited thereon. The copper rigidly adheres to the circuit board with a good bond and the circuit board so produced by this novel process avoids any necessity of etching away materials previously deposited on the board or removing conformal coating or photoresist materials such as occurs and is done in present conventional processes. It is hence a fully additive process. Further the process does not require the injection of any impurity in the laminate as is found in some other additive plating processes. This eliminates the possibility that such impurities may cause degradation of electrical properties.

The process uses conventional laminate materials and techniques and then can be adopted without requiring extensive engineering changeovers and with minimal expense. And in employing conventional glass-epoxy and paper-epoxy laminates, no need exists that would require extensive changes and qualification tests of laminate suppliers.

It is understood that various changes in form and detail and even improvements to the invention may be made by those skilled in the art which come within the scope of the aforedescribed invention. Accordingly my invention as set forth in the appended claims is to be construed as broadly as possible.

What is claimed is:

1. A fully additive process for manufacturing circuit boards having printed electrical conductors upon the top and bottom sides thereof and electrically conductive through-hole connections therebetween from a conventional board material of the group consisting of glass-epoxy, and paper-epoxy, and paper phenolic laminates, having a buttercoat, comprising the steps of:

forming a plurality of passages between the top and bottom surfaces of said board in a predetermined pattern;

immersing said circuit board in an organic solvent for rendering the finish on the buttercoat receptive to an etchant acid;

rinsing said board in water for removing said organic solvent;

immersing said board in an acid bath for chemically etching the surfaces thereof and the passages therethrough;

rinsing said board in water;

immersing said board in a caustic solution for neutralizing any traces of acid remaining on said board;

rinsing said board in an acid solution for neutralizing any traces of caustic solution remaining on said board and giving said board an acidic character;

immersing said board in an acidic tin-palladium catalyst solution for catalyzing the surfaces of said board;

rinsing said board in water to remove excess catalyst;

immersing said board in a catalyst accelerator solution whereby metal palladium ions are freed from the catalytic tin-palladium solution for subsequent attraction to copper metal;

rinsing said board in water;

drying said board;

applying a material to the top and bottom surfaces of said board in the negative facsimile of the conductor pattern to be placed upon the top and bottom surfaces of said board, said covering material comprising a heat-settable electrically insulative material which in its set state rigidly adheres to the surfaces of said board and withstands without effect immersion in an electroless copper plating solution for periods of approximately 5 hours;

heating said board for setting said thermosetting material; and immersing said board in an electroless copper plating solution for approximately 5 hours to deposit copper on the portions of the substrate uncovered by said thermosetting material, whereby electrically conductive paths of copper are formed on the surfaces of the substrate and on the walls of the passages formed through the substrate without the necessity of etching away plated materials or stripping away masking materials.

2. An additive method of forming a configuration of electrically conductive paths upon the top and bottom surfaces of an insulating substrate in the group of glass-epoxy paper-epoxy and paper-phenolic laminate and through-hole conductive connections therebetween comprising the steps of:

forming a predetermined plurality of holes through said insulating substrate material in a prearranged pattern;

immersing said substrate in an organic solvent for between 3 to 10 minutes at 80° F., said solvent comprising di-methyl formamide;

rinsing said substrate in water;

immersing said substrate in a chromic acid solution of specific gravity 1.3 to 1.4 for approximately 5 minutes at a temperature of 150° F.;

rinsing said substrate in water;

immersing said substrate in a sodium hydroxide solution of pH factor 12.3 at a temperature of 120° F. for approximately 3 minutes to neutralize the chromic acid traces remaining on said substrate;

rinsing said substrate in a hydrochloric acid solution, 20 percent by volume, for 30 seconds to 1 minute to eliminate any traces of the sodium hydroxide remaining from the previous step and to render any trace solution on the substrate acidic in nature;

immersing said substrate in a solution comprising colloidal palladium having a protective stannic acid colloid in hydrochloric acid for 2 minutes at ambient temperature to condition the surface of said board;

rinsing said substrate in water;

immersing said substrate in an accelerator whereby freeing palladium in ionic form to deposit colloidal palladium upon the surface of the board for attraction to copper metal;

rinsing said substrate in water;

drying the laminate;

applying a negative facsimile of the desired conductor configuration on the top and bottom surfaces of said substrate with an electrically insulative thermosetting material in its unset state, said material being having a characteristic which in its set state is capable of withstanding immersion in an electroless copper plating solution for a period of approximately 5 hours without decomposition and without receiving a copper plating, and comprising a synthetic ester resin, said facsimile leaving exposed patterns on said substrate wherein it is desired to provide electrically conductive paths;

heating said substrate to set said thermosetting material and provide a solid adherent permanent electrically insulating covering over the desired portions of said substrate;

immersing said substrate in an electroless copper plating solution at a temperature of 120° F. for a period of approximately 5 hours to deposit copper on the portions of the substrate uncovered by said thermosetting material, whereby electrically conductive paths of copper are formed on the surfaces of the substrate and on the walls of the passages formed through the substrate without the necessity of etching away plated materials or stripping away masking materials.

* * * * *